(12) United States Patent
Duperray

(10) Patent No.: US 6,507,244 B2
(45) Date of Patent: Jan. 14, 2003

(54) TRANSMITTER WITH A SLIDING COMPRESSION POINT

(75) Inventor: David Duperray, Sunnyvale, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 29 days.

(21) Appl. No.: 09/866,906

(22) Filed: May 29, 2001

(65) Prior Publication Data
US 2002/0180522 A1 Dec. 5, 2002

(51) Int. Cl.[7] .............................. H03G 3/20; H03F 3/38; H03F 1/26
(52) U.S. Cl. ........................... 330/136; 330/10; 330/149
(58) Field of Search ...................... 330/10, 136, 149

(56) References Cited

U.S. PATENT DOCUMENTS 5,049,832 A * 9/1991 Cavers ........................ 330/149
5,598,127 A * 1/1997 Abbiati et al. ............... 330/149

* cited by examiner

Primary Examiner—Patricia Nguyen
(74) Attorney, Agent, or Firm—Theodorus Mak

(57) ABSTRACT

A transmitter has a power amplifier amplifying a radio frequency transmit signal. The radio frequency transmit signal is a non-constant envelope modulated signal. The power amplifier has a first compression point. In a method for sliding a compression point in the transmitter, the power amplifier is operated at a first backoff from the first compression point such that a given adjacent channel power ratio requirement is met for a first peak-to-average ratio of the radio frequency transmit signal. The first compression point is slide to a second compression point for a second peak-to-average ratio of the radio frequency transmit signal, the second compression point being lower than the first compression point. The first and second peak-to-average ratios are dependent on information content of the non-constant envelope modulated signal.

21 Claims, 1 Drawing Sheet

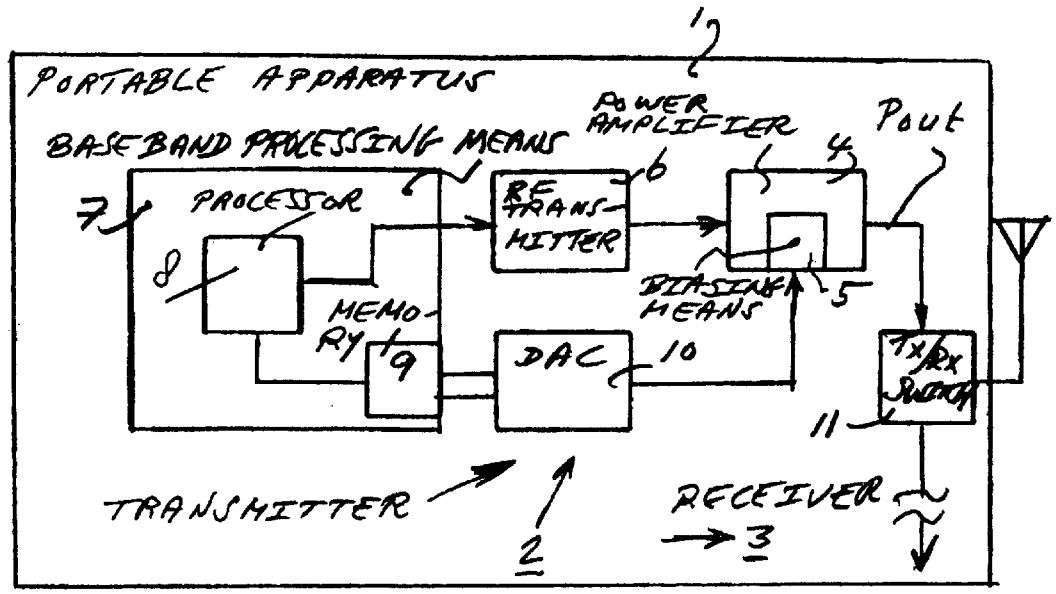
FIG. 1
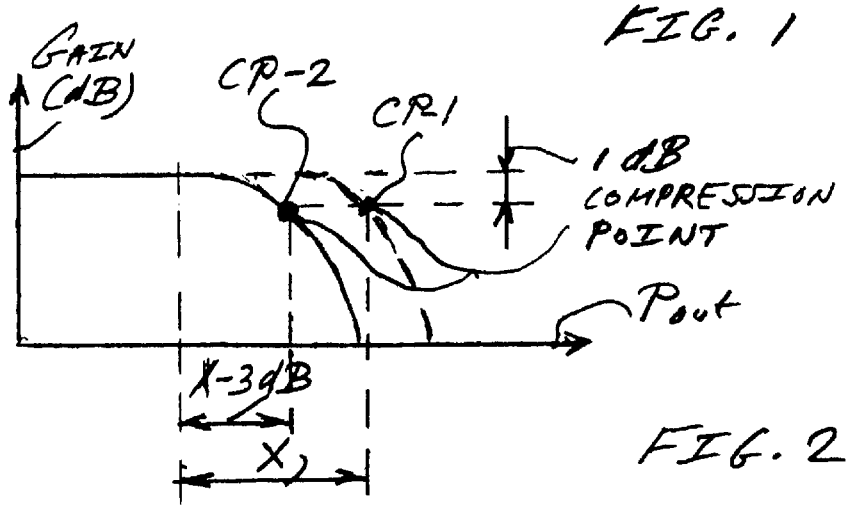
FIG. 2
FIG. 3

TRANSMITTER WITH A SLIDING COMPRESSION POINT

BACKGROUND OF THE INVENTION

1. Field of the Invention

The invention relates to a transmitter with a power amplifier that amplifies a radio frequency transmit signal that is a non-constant envelope modulated signal.

The invention further relates to a portable apparatus including such a transmitter, to a module including such a transmitter, and to a method for sliding a compression point in such a transmitter. Such transmitters may be used in CDMA systems referred to as linear modulation systems, or any other suitable device or system with non-constant envelope modulated signals requiring linear modulation, in which information is carried as phase and amplitude modulated information.

2. Description of the Related Art

In U.S. Pat. No. 5,936,464 a method for reducing distortion in a high efficiency power amplifier is disclosed. The power amplifier is included in a communication device that transmits signals having information in both amplitude and phase. Such transmission requires low distortion to be achieved by so-called linear modulation techniques. Non-linear operation, in addition to distortion and loss of information, causes an increase in intermodulation products that cause undesirable amounts of energy to be present in frequency bands other than the one intended for use. This undesirable energy is commonly quantified and termed Adjacent Channel Power (ACP), or referred to as Adjacent Channel Power Ratio (ACPR). Driving the power amplifier into saturation increases efficiency of the power amplifier but also causes intermodulation products to rise, so a tradeoff is needed between high efficiency and low intermodulation products. High efficiency is of particular importance when the transmitter is used in a battery operated portable apparatus, for saving battery power. In U.S. Pat. No. 5,936,464, in a so-called Envelope Elimination and Restoration (EER) type amplifier, efficiency is gained by operating the final power amplifier at or near saturation. When operating at or near saturation, the amplifier is operating at a region of compression, where as drive levels change, the phase of the output also changes. Even though the amplifier is constantly at or near saturation, the compression point is changing as the drain bias of the final power amplifier changes. U.S. Pat. No. 5,936,464 provides a strategy for minimizing phase errors in a power amplifier which are a function of changes in the compression point. In U.S. Pat. No. 5,936,464 though, the power amplifier is operated at a substantially constant compression point so as to minimize phase error contributions from the final power amplifier.

SUMMARY OF THE INVENTION

It is an object of the invention to provide a transmitter that operates at a backoff from a power amplifier compression point for an average input signal level of a non-constant envelope modulated signal input to a power amplifier comprised in the transmitter, while still meeting a given adjacent power ratio requirement for a peak-to-average ratio of a radio frequency transmit signal, for different information content of the non-constant envelope modulated signal.

It is another object of the invention to provide such a transmitter that is configurable to transmit information content in accordance with different radio configurations.

To this end, a transmitter is provided comprising:
power amplifier means for amplifying a radio frequency transmit signal, said power amplifier means having a first compression point, said radio frequency transmit signal being a non-constant envelope modulated signal; operating means for operating said power amplifier means at a first backoff from said first compression point such that a given adjacent channel power ratio requirement is met for a first peak-to-average ratio of said radio frequency transmit signal; and sliding means for sliding said first compression point to a second compression point for a second peak-to-average ratio of said radio frequency transmit signal, said second compression point being lower than said first compression point, said first and second peak-to-average ratios being dependent on information content of said non-constant envelope modulated signal.

In a preferred embodiment, the compression point is slide so as to just meet the ACPR requirement, for the new compression point, thereby achieving maximal power savings, the same ACPR is obtained for a lower peak-to-average ratio of the modulated signal at the new compression point than the ACPR for the higher peak-to-average ratio of the modulated signal at the old compression point, the peak-to-average ratios being dependent on the information content of the non-constant envelope modulated signal. In other embodiments, the compression point may be slide to ACPRs that are higher at the new compression point that at the old compression point, thereby still achieving power savings.

In an embodiment, the information content is determined by a current radio configuration according to which the transmitter transmits the radio frequency signal. In CDMA systems, such radio configurations include the number of channels, the data rate per channel, the orthogonal code per channel, the type of encoder to be used, and other parameters that are related to the information content of the signal to be transmitted. The transmitter may be configured to transmit signals that have information content in accordance to different radio configurations, and therefore have different peak-to-average ratios. The compression point is set in accordance with these different radio configurations.

In an embodiment, the different radio configurations and related peak-to-average ratios are included in a look-up table, and the compression point is set in accordance with a current radio configuration, thereby using the look-up table. For multi-standard operation of the transmitter, the look-up table may be multi-dimensional, with separate entries for different standards. In that embodiment, the transmitter may have different power amplifiers for different standards that are respectively powered-up for the transmitter operating in accordance with a current radio standard, the other power amplifiers being powered down.

In an embodiment, the compression point may be slide by adjusting a biasing current in the power amplifier.

BRIEF DESCRIPTION OF THE DRAWING

FIG. 1 is a block diagram of a portable apparatus according to the invention.

FIG. 2 is a gain versus output power characteristic of a power amplifier in a transmitter according to the invention.

FIG. 3 is a look-up table according to the invention.

Throughout the figures the same reference numerals are used for identifying the same elements.

DESCRIPTION OF THE DETAILED EMBODIMENTS

FIG. 1 is a block diagram of a portable apparatus 1 according to the invention. The portable apparatus 1 can be a mobile phone, a PDA with a wireless extension, a PC with a wireless extension, or a combination of any other radio frequency device with other devices. The portable apparatus 1 comprises a transmitter 2, and, optionally, a receiver 3 (not shown in detail here). Transmitter 2, and, optionally receiver 3, may be included in a module for such a portable apparatus 1 that may be sold separately by a module manufacturer to an apparatus manufacturer. Transmitter 2 comprises a power amplifier 4 with biasing means 5 to set and/or adjust a biasing current of power amplifier 4, more particularly a compression point of power amplifier 4. Transmitter 2 further comprises a radio frequency transmitter 6 and a base band processing means 7. Base band processing means 7 comprises a processor with memory 9 that comprises a look-up table according to the invention. Transmitter 2 further comprises a digital-to-analog converter 10 that converts a digital compression point adjustment signal to an analog compression point adjustment signal that controls biasing means 5. Transmitter 2 is configured to transmit radio frequency signals that are non-constant envelope signals. In case portable apparatus 1 comprises a receiver so that it operates as a transceiver, portable apparatus 1 comprises a transmit/receive switch 11. Such non-constant envelope signals have information in both amplitude and phase. Transmission of such signals requires the use of linear modulation techniques and high linearity of power amplifier 4 for at least an average input signal level of the non-constant envelope modulated transmit signal, at least to the extent that ACPR requirements are met for a peak-to-average ratio of the transmit signal. In this respect it is to be realized that, due to overall system closed loop power control requirements, for portable apparatuses suitable for CDMA systems, for instance, transmit signals exhibit a large dynamic range. Therefore, the transmit signal momentarily may exhibit large signal peaks, considerably beyond the average output power provided by power amplifier 4. For this reason, linear maximum average output power is set at a backoff with respect to a so-called 1 dB compression point of power amplifier 4 so that ACPR requirements are met.

FIG. 2 is a gain versus output power characteristic of power amplifier 4 in transmitter 2 according to the invention. Power amplifier 4 provides an amplified version of a non-constant envelope modulated signal that is provided by base band processing means 7 and that is carrier modulated by RF-transmitter 6. A dashed line shows a characteristic with a first 1 dB compression point CP-1, and a solid line shows a characteristic shows a second 1 dB compression point CP-2. Compression point CP-1 is set for a first peak-to-average ratio of the transmit signal, and compression point CP-2 is set for a second, lower peak-to-average ratio of the transmit signal, i.e., compression point CP-2 is slide or shifted with respect to compression point CP-1. In accordance with the invention, the first and second peak-to-average ratios are dependent on information content of the non-constant envelope modulated signal, i.e., current use of the transmitter for transmission of a particular type or types of information, such as data at different rates, voice, video conferencing where multiple channels are being used. The invention is based on the insight that different use of transmitter 2 has different statistical behavior and therefore different peak-to-average ratios. For peak-to-average ratios lower than a maximum, worst case expected peak-to-average ratio for which power amplifier 4 is designed, in order to save battery power, it is therefore advantageous to lower the compression point, preferably to such an extent that the ACPR is still just met for the lower peak-to-average transmit signal. In an example, transmitter 2 may have been designed for 75 dB dynamic range transmit signals, may have 1 dB compression point CP-1 at +32 dBm, for a 7.0 peak-to-average ratio, and have 4 dB backoff, and may have 1 dB compression point CP-2 sliding of 3 dB, for a 3.5 dB peak-to-average ratio. Simulations for such a typical example have shown ACPR requirements are still met while power amplifier efficiency has improved by 2.5% per dB compression point sliding. Shown is backoff X at compression point CP-1, and backoff X−3 dB at compression point CP-2.

In systems such as CDMA systems, advantageously the compression point of power amplifier 4 is adjusted in accordance with a current radio configuration transmitter 4 should meet. In case of a transceiver, the receiver receives radio configuration information from the CDMA system via the so-called radio interface of the CDMA system. 3GPP2 Standard C.S0002-A, "Physical Layer Standard for CDMA2000 Spread Spectrum Systems, Release A, pp. 2–53 to 2–93, published Jun. 9, 2000, shows signals transmitted on the so-called reverse channel that are specified by radio configurations, and various radio configurations. Such radio configurations, among other things, define the number of channels, the data rate per channel, the orthogonal code to be used per channel, and the type of encoder to be used. Particularly referred is to page 2–54, Table 2.1.3.1-1. showing six radio configurations with different data rates and different types of modulation. Simulation has shown that different radio configurations have different peak-to-average ratios. For a multiple radio standards portable apparatus 1, look-up table 20 may have separate entries for different standards. Look-up table 20 may be pre-loaded with radio configuration and peak-to-average ratio information so that the system may indicate what pre-loaded configuration should be currently used by identifying the current radio configuration.

FIG. 3 is a look-up table 20 according to the invention, with peak-to-average ratios P-t-A-1, P-t-A-2 to P-t-A-n, n being an integer, for respective radio configurations RC-1, RC-2 to RC-n. In accordance with the invention, for a current radio configuration RC-i, compression point of power amplifier 4 is set using the peak-to-average ratio at an entry of look-up table indicated by current radio configuration RC-i. Simulation has shown that the choice of the spreading code directly affects the waveform of the peak-to-average ratio and thereby the peak-to-average ratio. Such a relationship can easily be verified by a person of ordinary skill in the art, without undue experimentation.

In addition to taking into account peak-to-average ratios for determining a compression point of power amplifier 4, further temperature and battery supply voltage variations may be taken into account. In that case, portable apparatus 1 may have a temperature sensor and a battery voltage sensor.

In view of the foregoing it will be evident to a person skilled in the art that various modifications may be made within the spirit and the scope of the invention as hereinafter defined by the appended claims and that the invention is thus not limited to the examples provided. The word "comprising" does not exclude the presence of other elements or steps than those listed in a claim.

What is claimed is:

1. A transmitter comprising:

power amplifier means for amplifying a radio frequency transmit signal, said power amplifier means having a first compression point, said radio frequency transmit signal being a non-constant envelope modulated signal;

operating means for operating said power amplifier means at a first backoff from said first compression point such that a given adjacent channel power ratio requirement is met for a first peak-to-average ratio of said radio frequency transmit signal;

sliding means for sliding said first compression point to a second compression point for a second peak-to-average ratio of said radio frequency transmit signal, said second compression point being lower than said first compression point, said first and second peak-to-average ratios being dependent on information content of said non-constant envelope modulated signal.

2. A transmitter as claimed in claim 1, wherein said second compression point is chosen such that said given adjacent channel power ratio requirement is still met.

3. A transmitter as claimed in claim 1, wherein, upon said sliding, said operating means is configured to operate said power amplifier means at a second backoff from said second compression point, said second backoff being less than said first backoff.

4. A transmitter as claimed in claim 3, wherein said second backoff is chosen such that for said second peak-to-average ratio said given adjacent channel power ratio requirement is just met.

5. A transmitter as claimed in claim 1, wherein said information content is determined by a radio configuration.

6. A transmitter as claimed in claim 1, said transmitter being configurable to transmit said information content in accordance with at least first and second radio configurations, said first peak-to-average ratio corresponding to said first radio configuration and said second peak-to-average ratio corresponding to said second radio configuration.

7. A transmitter as claimed in claim 6, wherein said first and second radio configurations, and said first and second peak-to-average ratios are included in a look-up table.

8. A transmitter as claimed in claim 7, said transmitter further comprising further power amplifier means for amplifying a further radio frequency transmit signal that is a further non-constant envelope modulated signal conveying further information content in accordance with a first radio standard, and means for selecting said power amplifier means and said further power amplifier means, said non-constant envelope modulated signal conveying said information content in accordance with a second radio standard, said look-up table including separate entries for said first and second radio standards.

9. A transmitter as claimed in claim 1, wherein said sliding means are configured to slide said first compression point to said second compression point by adjusting a biasing current in said power amplifier means.

10. A portable apparatus with a transmitter, said transmitter comprising:

power amplifier means for amplifying a radio frequency transmit signal, said power amplifier means having a first compression point, said radio frequency transmit signal being a non-constant envelope modulated signal;

operating means for operating said power amplifier means at a first backoff from said first compression point such that a given adjacent channel power ratio requirement is met for a first peak-to-average ratio of said radio frequency transmit signal;

sliding means for sliding said first compression point to a second compression point for a second peak-to-average ratio of said radio frequency transmit signal, said second compression point being lower than said first compression point, said first and second peak-to-average ratios being dependent on information content of said non-constant envelope modulated signal.

11. A portable apparatus as claimed in claim 10, wherein said second compression point is chosen such that said given adjacent channel power ratio requirement is still met.

12. A portable apparatus as claimed in claim 10, wherein, upon said sliding, said operating means is configured to operate said power amplifier means at a second backoff from said second compression point, said second backoff being less than said first backoff.

13. A portable apparatus as claimed in claim 12, wherein said second backoff is chosen such that for said second peak-to-average ratio said given adjacent channel power ratio requirement is just met.

14. A portable apparatus as claimed in claim 10, wherein said information content is determined by a radio configuration.

15. A portable apparatus as claimed in claim 10, wherein said sliding means are configured to slide said first compression point to said second compression point by adjusting a biasing current in said power amplifier means.

16. A portable apparatus as claimed in claim 10, said portable apparatus further comprising a receiver.

17. A module for a portable apparatus, said module having a transmitter, said transmitter comprising:

power amplifier means for amplifying a radio frequency transmit signal, said power amplifier means having a first compression point, said radio frequency transmit signal being a non-constant envelope modulated signal;

operating means for operating said power amplifier means at a first backoff from said first compression point such that a given adjacent channel power ratio requirement is met for a first peak-to-average ratio of said radio frequency transmit signal;

sliding means for sliding said first compression point to a second compression point for a second peak-to-average ratio of said radio frequency transmit signal, said second compression point being lower than said first compression point, said first and second peak-to-average ratios being dependent on information content of said non-constant envelope modulated signal.

18. A module as claimed in claim 17, wherein, upon said sliding, said operating means is configured to operate said power amplifier means at a second backoff from said second compression point, said second backoff being less than said first backoff.

19. A module as claimed in claim 17, wherein said information content is determined by a radio configuration.

20. A module as claimed in claim 17, said module further comprising a receiver.

21. A method for sliding a compression point in a transmitter, said transmitter having a power amplifier amplifying a radio frequency transmit signal, said power amplifier having a first compression point, said radio frequency transmit signal being a non-constant envelope modulated signal, said method comprising:

operating said power amplifier at a first backoff from said first compression point such that a given adjacent channel power ratio requirement is met for a first peak-to-average ratio of said radio frequency transmit signal;

sliding said first compression point to a second compression point for a second peak-to-average ratio of said radio frequency transmit signal, said second compression point being lower than said first compression point, said first and second peak-to-average ratios being dependent on information content of said non-constant envelope modulated signal.

* * * * *